United States Patent
Tanaka

(10) Patent No.: US 12,200,990 B2
(45) Date of Patent: Jan. 14, 2025

(54) DISPLAY DEVICE AND METHOD OF DRIVING DISPLAY DEVICE

(71) Applicant: SHARP KABUSHIKI KAISHA, Sakai (JP)

(72) Inventor: Kohhei Tanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 528 days.

(21) Appl. No.: 17/765,168

(22) PCT Filed: Oct. 3, 2019

(86) PCT No.: PCT/JP2019/039061
§ 371 (c)(1),
(2) Date: Mar. 30, 2022

(87) PCT Pub. No.: WO2021/064930
PCT Pub. Date: Apr. 8, 2021

(65) Prior Publication Data
US 2022/0344445 A1 Oct. 27, 2022

(51) Int. Cl.
*H10K 59/131* (2023.01)
*H01L 29/786* (2006.01)
*H10K 59/121* (2023.01)

(52) U.S. Cl.
CPC ..... *H10K 59/131* (2023.02); *H01L 29/78672* (2013.01); *H01L 29/7869* (2013.01); *H10K 59/1213* (2023.02); *H10K 59/1216* (2023.02)

(58) Field of Classification Search
CPC ........ G09G 3/30; G09G 3/20; H10K 59/1213; H10K 59/131; H10K 59/1216; H01L 29/7869; H01L 27/1225; H01L 29/78672
See application file for complete search history.

(56) References Cited

U.S. PATENT DOCUMENTS 7,218,294 B2 * 5/2007 Koyama .............. G09G 3/3233
313/504
7,477,218 B2 * 1/2009 Koga ................... G09G 3/3233
345/80

(Continued)

FOREIGN PATENT DOCUMENTS

JP 2006039521 A 2/2006
JP 2007293328 A 11/2007
(Continued)

*Primary Examiner* — Vinh T Lam
(74) *Attorney, Agent, or Firm* — ScienBiziP, P.C.

(57) ABSTRACT

A display device includes: a display unit including a plurality of first scan lines, a plurality of second scan lines, a plurality of data lines, and a plurality of pixel circuits; and a drive circuit configured to drive the first scan lines, the second scan lines, and the data lines. Each of the pixel circuits includes: a light-emitting element; a drive transistor configured to control a magnitude of an electric current that flows through the light-emitting element, a first compensation transistor having a control terminal connected to an associated one of the first scan lines; and a second compensation transistor having a control terminal connected to an associated one of the second scan lines. The first and second compensation transistors are connected in series and disposed between a control terminal and a conduction terminal of the drive transistor, the conduction terminal leading to the light-emitting element.

20 Claims, 9 Drawing Sheets

(56) References Cited

U.S. PATENT DOCUMENTS

| | | | |
|---|---|---|---|
| 8,686,926 B2* | 4/2014 | Han | G09G 3/3233 |
| | | | 345/82 |
| 9,355,597 B2* | 5/2016 | Yang | G09G 3/3225 |
| 9,647,047 B2* | 5/2017 | Jeong | H10K 59/1213 |
| 9,858,880 B2* | 1/2018 | Dai | G09G 3/3266 |
| 10,885,847 B2* | 1/2021 | Wang | H01L 27/1218 |
| 10,930,212 B2* | 2/2021 | Qian | G09G 3/3291 |
| 11,127,349 B2* | 9/2021 | Kobayashi | G09G 3/3233 |
| 11,145,254 B2* | 10/2021 | Nam | G09G 3/3233 |
| 11,404,527 B2* | 8/2022 | Furukawa | G09F 9/30 |
| 11,468,834 B2* | 10/2022 | Ma | G09G 3/3233 |
| 2005/0285151 A1 | 12/2005 | Kawasaki | |
| 2007/0229412 A1 | 10/2007 | Kawasaki et al. | |
| 2008/0259000 A1 | 10/2008 | Kawasaki | |
| 2009/0201231 A1 | 8/2009 | Takahara et al. | |
| 2012/0001948 A1* | 1/2012 | Toyomura | G09G 3/3233 |
| | | | 345/77 |
| 2013/0321376 A1* | 12/2013 | Kim | G09G 3/3233 |
| | | | 345/212 |
| 2014/0124770 A1 | 5/2014 | Kawasaki | |
| 2015/0154899 A1* | 6/2015 | Chang | G09G 3/3648 |
| | | | 345/55 |
| 2017/0186373 A1 | 6/2017 | Nishikawa et al. | |
| 2017/0365647 A1 | 12/2017 | Choi et al. | |
| 2018/0342208 A1 | 11/2018 | Nishikawa et al. | |

FOREIGN PATENT DOCUMENTS

| | | |
|---|---|---|
| JP | 2009276744 A | 11/2009 |
| WO | 2015/190407 A1 | 12/2015 |

* cited by examiner

DISPLAY DEVICE AND METHOD OF DRIVING DISPLAY DEVICE

TECHNICAL FIELD

The disclosure relates in general to display devices and in particular to display devices including pixel circuits including current-driven light-emitting elements.

BACKGROUND ART

MED display devices that include pixel circuits including OLEDs (organic light-emitting diodes) have been in practical use for some time. Each pixel circuit in the OLED display device includes, for example, a drive transistor and a write control transistor, as well as an OLED. These transistors are thin film transistors ("TFTs"). The OLED is a current-driven light-emitting element that emits light at a luminance that matches the magnitude of the electric current flowing through the OLED. The drive transistor is connected in series with the OLED to control the magnitude of the electric current flowing through the OLED.

The drive transistor has characteristics that can vary and fluctuate. A high-quality image display on an OLED display device is therefore impossible without compensating for variations and fluctuations of the characteristics of the drive transistor. It is known that such compensation of drive transistor characteristics in the OLED display device can be implemented inside the pixel circuit (internal compensation) or outside the pixel circuit (external compensation). In the OLED display device that implements internal compensation, the pixel circuit includes a compensation transistor between the gate terminal of the drive transistor and one of the conduction terminals of the drive transistor that leads to the light-emitting element.

Meanwhile, technology has been in practical use where transistors are formed of an oxide semiconductor such as indium gallium zinc oxide ("IGZO"). Such oxide semiconductor-based transistors have a characteristic, extremely low leak current when turned off. Use of an oxide semiconductor-based transistor as a compensation transistor therefore restrains electric charge leak through the gate terminal of the drive transistor and fluctuation of the gate potential of the drive transistor. In addition, low-frequency drive, where the drive transistors stop driving the light-emitting elements when the same image is to be continuously displayed, can reduce the power consumption of the OLED display device.

An OLED display device that implements internal compensation is described in, for example, Patent Literature 1. An OLED display device that implements low-frequency drive is described in, for example, Patent Literature 2.

CITATION LIST

Patent Literature

Patent Literature 1: Japanese Unexamined Patent Application Publication, Tokukai, No. 2009-276744
Patent Literature 2: PCT International Application Publication No, WO2015/190407

SUMMARY

Technical Problem

The known OLED display device that implements internal compensation suffers from washed-out black (a phenomenon where black appears slightly whitish in black display) if the drive transistor and the compensation transistor are of different conductivity types. FIG. 12 is a diagram of a part of a pixel circuit in a known OLED display device. FIG. 12 shows a TFT T4 that is a P-channel drive transistor and a TFT T2 that is a N-channel compensation transistor. The TFT T2 is disposed between the gate terminal and the drain terminal (conduction terminal leading to an OLED L1) of the TFT T4. The gate terminal of the TFT T2 is connected to a scan line Gi.

FIG. 13 is a timing chart for the known OLED display device. In FIG. 13, the period from time t1 to time t2 is a write period. The electrical potential on the scan line Gi goes HIGH at time t1, turning on the TFT T2. The TET T4 is also turned on in the write period. An electric current therefore flows from a data line Sj connected to the source terminal of the TFT T4 to the gate terminal of the TFT T4 via the TFTs 14 and 12, thereby increasing the gate potential of the TFT T4 to a level that matches the threshold voltage of the TFT T4 and the data potential applied to the data line Sj. At time t2, the electrical potential on the scan line Gi goes LOW, turning off the TFT T2. The pixel circuit needs to maintain the gate potential of the TFT T4 when the TFT T2 is turned off.

There exists a parasitic capacitance Cp between the gate terminal of the TFT 2 and one of the conduction terminals of the TFT T2 that is connected to the gate terminal of the TFT T4. The gate potential of the TFT T4 therefore decreases when the electrical potential on the scan line Gi decreases at time t2. Since the TFT T4 has a P-channel, a decrease in the gate potential of the TFT T4 causes an increase in the magnitude of the electric current flowing through the TFT T4, which in turn increases the luminance of the OLED L1 connected to the drain terminal of the TET T4, This phenomenon occurs also in black display. The known OLED display device hence allows for washed-out black and low contrast.

Washed-out black is problematic when, for example, the compensation transistor is replaced by an oxide semiconductor-based N-channel TFT to prevent fluctuation of the gate potential of the drive transistor in a pixel circuit constructed using a low-temperature polysilicon-based P-channel TFT.

A known method of preventing washed-out black is to increase the data potential. This method however requires increasing not only the data potential, but also the HIGH potential applied to the scan line. That in turn leads to increased power consumption of the OLED display device, the need to increase the breakdown voltage of the scan line drive circuit, and other problems.

That leaves us with an issue that a display device is needed that is capable of preventing washed-out black without having to changing the data potential where the display device includes a compensation transistor that has a different conductivity type from the drive transistor.

Solution to Problem

This issue can be solved by, for example, a display device including: a display unit including a plurality of first scan lines, a plurality of second scan lines, a plurality of data lines, and a plurality of pixel circuits; and a drive circuit configured to drive the plurality of first scan lines, the plurality of second scan lines, and the plurality of data lines, wherein each of the plurality of pixel circuits includes: a light-emitting element; a drive transistor configured to control a magnitude of an electric current that flows through the light-emitting element, the drive transistor being of a first conductivity type; a first compensation transistor having a control terminal connected to an associated one of the plurality of first scan lines, the first compensation transistor being of the first conductivity type; and a second compensation transistor having a control terminal connected to an associated one of the plurality of second scan lines, the second compensation transistor being of a second conductivity type, and the first and second compensation transistors are connected in series and disposed between a control terminal and a conduction terminal of the drive transistor, the conduction terminal leading to the light-emitting element.

The issue can be solved also by, for example, a method of driving a display device including: a display unit including a plurality of first scan lines, a plurality of second scan lines, a plurality of data lines, and a plurality of pixel circuits, each of the plurality of pixel circuits including: a light-emitting element; a drive transistor configured to control a magnitude of an electric current that flows through the light-emitting element, the drive transistor being of a first conductivity type; a first compensation transistor having a control terminal connected to an associated one of the plurality of first scan lines, the first compensation transistor being of the first conductivity type; and a second compensation transistor having a control terminal connected to an associated one of the plurality of second scan lines, the second compensation transistor being of a second conductivity type, the first and second compensation transistors being connected in series and disposed between a control terminal and a conduction terminal of the drive transistor, the conduction terminal leading to the light-emitting element, the method including: controlling so as to turn on both the first and second compensation transistors in the plurality of pixel circuits; turning off the first compensation transistor when both the first and second compensation transistors are ON; and turning off the second compensation transistor when the first compensation transistor is OFF and the second compensation transistor is ON.

Advantageous Effects of Disclosure

According to these display device and method of driving a display device, the first and second compensation transistors, which are connected in series and of different conductivity types, are disposed between the control terminal of the drive transistor and one of the conduction terminals of the drive transistor that leads to the light-emitting element, so as to enable suitable control of the conduction states of the first and second compensation transistors. This technique can restrain the electrical potential on the control terminal of the drive transistor from changing in such a manner as to increase the luminance of the light-emitting element, which could otherwise be caused by the turning-off of the second compensation transistor of a different conductivity type from the drive transistor, thereby restraining washed-out black.

DESCRIPTION OF EMBODIMENTS

First Embodiment

Figure 1:
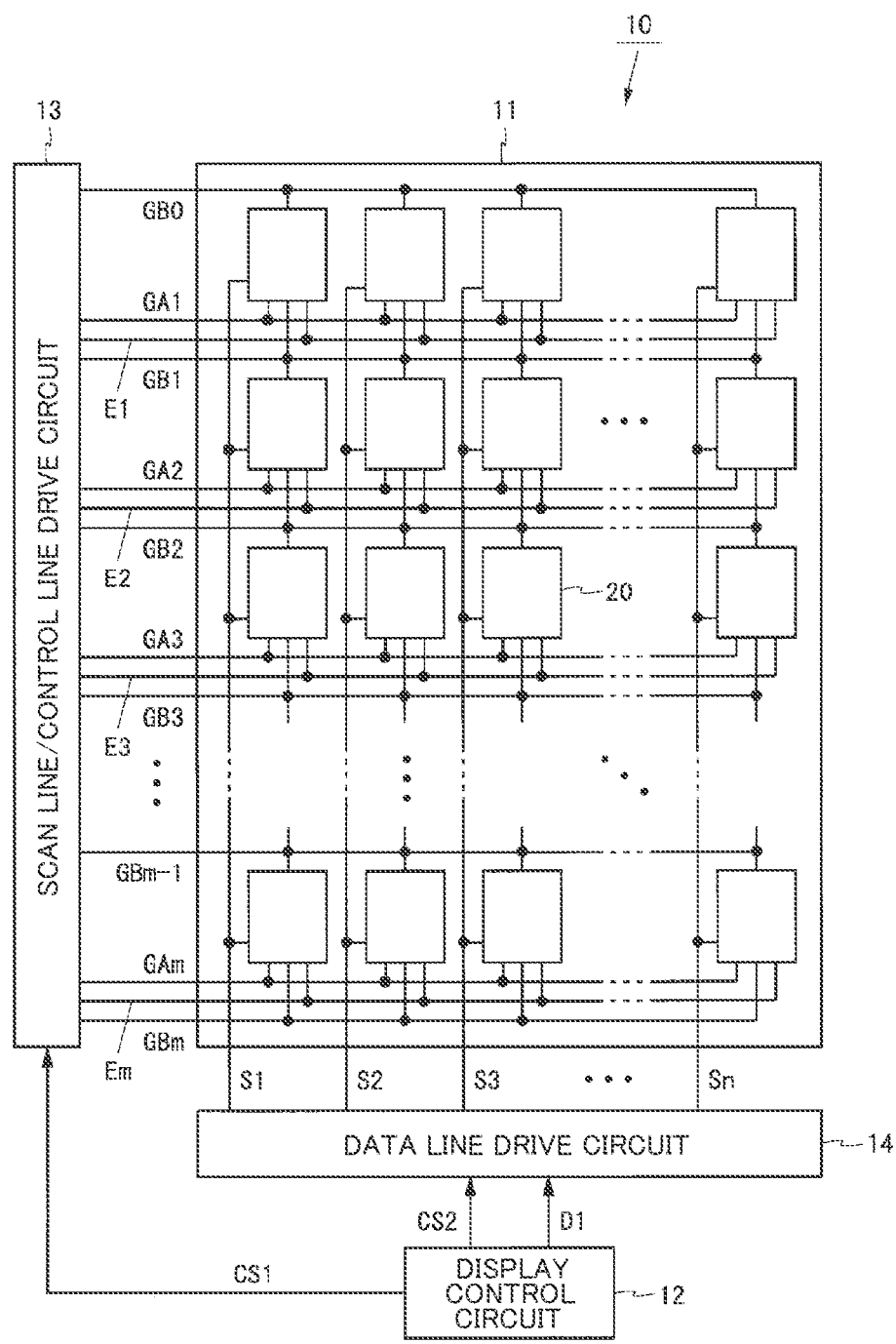
FIG. 1 is a block diagram of a structure of a display device in accordance with a first embodiment.

FIG. 1 is a block diagram of a structure of a display device in accordance with a first embodiment. A display device 10 in FIG. 1 is an OLED display device including a display unit 11, a display control circuit 12, a scan line/control line drive circuit 13, and a data line drive circuit 14. Throughout the following description, m and n are an integer greater than or equal to 2, i is an integer greater than or equal to 1 and less than or equal to m, and j is an integer greater than or equal to 1 and less than or equal to n.

The display unit 11 includes in first scan lines GA1 to GAm, (m+1) second scan lines GB0 to Gam, in light-emission control lines E1 to Em, n data lines S1 to Sn, and (m×n) pixel circuits 20. The first scan lines GA1 to GAm, the second scan lines GB0 to GBm, and the light-emission control lines E1 to Em are disposed parallel to each other. The data lines S1 to Sn are disposed parallel to each other so as to be perpendicular to, for example, the first scan lines GA1 to GAm. The first scan lines GA1 to GAm and the data lines S1 to Sn form (m×n) intersections. The (m×n) pixel circuits 20 are disposed respectively for the intersections of the first scan lines GA1 to GAm and the data lines S1 to Sn. The pixel circuits 20 are fed with a HIGH power supply electrical potential ELVDD, a LOW power supply electrical potential ELVSS, and an initialization electrical potential Vini through electrically conductive members (not shown).

The display control circuit 12 outputs a control signal CS1 to the scan line/control line drive circuit 13 and outputs a control signal CS2 and a data signal Di to the data line drive circuit 14, The scan line/control line drive circuit 13 is a circuit in which a scan line drive circuit and a control line drive circuit (neither shown) are integrated. The scan line/control line drive circuit 13 drives the first scan lines GA1 to GAm, the second scan lines GB0 to GBm, and the light-emission control lines E1 to Em in accordance with the control signal CS1. The data line drive circuit 14 drives the data lines S1 to Sn on the basis of the control signal CS2 and the data signal Dl. The scan line/control line drive circuit 13 and the data line drive circuit 14 function as a drive circuit for driving the first scan lines GA1 to GAm, the second scan lines GB0 to GBm, and the data lines S1 to Sn.

FIG. 1 shows the single scan line/control line drive circuit 13 disposed along a side of the display unit 11 so that the single scan line/control line drive circuit 13 can drive, for example, the first scan lines GA1 to GAm from the left side. Alternatively, there may be provided two scan line/control line drive circuits 13 along opposite sides of the display unit 11 respectively so that the two scan line/control line drive circuits 13 can drive, for example, the first scan lines GA1 to GAm from both sides.

Figure 2:
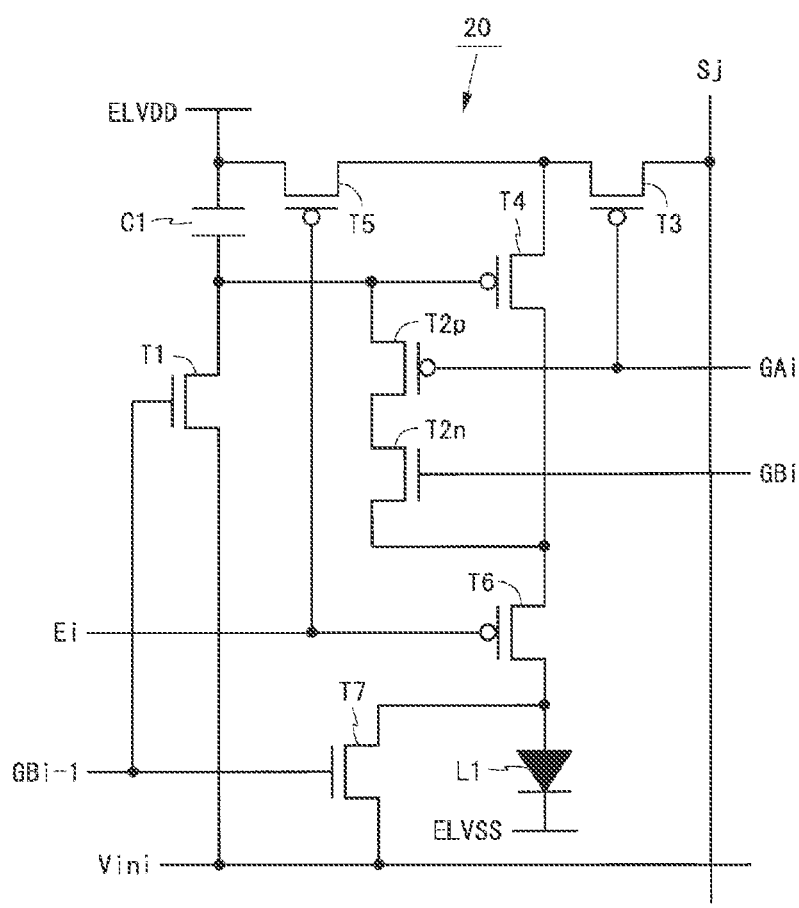
FIG. 2 is a circuit diagram of a pixel circuit in the display device shown in FIG. 1.

FIG. 2 is a circuit diagram of the pixel circuit 20. The pixel circuit 20 in FIG. 2 is a pixel circuit in row i, column j. The pixel circuit 20 includes eight TFTs T1, T2n, T2p, and T3 to T7, an OLED L1, and a capacitor C1 and is connected to the first scan line GAi, the second scan lines GBi−1 and GBi, the light-emission control line Ei, and the data line Sj. The second scan line GBi−1 is the second scan line that is selected immediately before the second scan line GBi. The TFTs T2p and T3 to 16 are P-channel TFTs. The TFTs T1, T2n, and T7 are N-channel TFTs. The P-channel. TFTs in the pixel circuit 20, including the TFT T2p, are made of a low-temperature polysilicon. The N-channel TFTs in the pixel circuit 20, including the TFT T2n, are made of an oxide semiconductor such as IGZO. The P-channel TFTs and the N-channel TFTs in the pixel circuit 20 may be made of other materials.

The HIGH power supply electrical potential ELVDD is applied to the source terminal of the TFT T5. One of the conduction terminals of the TFT T3 (the right side terminal in FIG. 2) is connected to the data line Sj. The drain terminal of the TFT T5 and the other conduction terminal of the TFT T3 are connected to the source terminal of the TFT T4. The drain terminal of the TFT T4 is connected to the source terminal of the TFT T6. The drain terminal of the TFT T6 is connected to the anode terminal of the OLED L1 and the drain terminal of the TFT T7. The LOW power supply electrical potential ELVSS is applied to the cathode terminal of the OLED L1. The drain terminal of the TFT T1 is connected to the gate terminal of the TFT T4. The initialization electrical potential Vini is applied to the source terminals of the TFTs T1 and T7.

The TFTs T2n and T2p are connected in series and disposed between the gate terminal and the drain terminal (conduction terminal leading to the OLED L1) of the TFT T4. To describe it in more detail, the TFT T2p has a first conduction terminal (top side terminal in FIG. 2) connected to the gate terminal of the TFT T4. The TFT T2p has a second conduction terminal connected to a second conduction terminal (top side terminal in FIG. 2) of the TFT T2n. The TFT T2n has a first conduction terminal connected to the drain terminal of the TFT T4 and the source terminal of the TFT T6. The gate terminals of the TFTs T2p and T3 are connected to the first scan line GAi. The gate terminal of the TFT T2n is connected to the second scan line GBi. The gate terminals of the TFTs T1 and T7 are connected to the second scan line GBi−1. The gate terminals of the TFTs T5 and T6 are connected to the light-emission control line Ei.

The OLED L1 functions as a light-emitting element in the pixel circuit 20. The TFT T4 functions as a drive transistor of a first conductivity type for controlling the magnitude of the electric current flowing through the light-emitting element. The TFT T2p functions as a first compensation transistor of the first conductivity type, with the control terminal thereof being connected to the first scan line GAi. The TFT T2n functions as a second compensation transistor of a second conductivity type, with the control terminal thereof being connected to the second scan line GBi. The first compensation transistor and the second compensation transistor are connected in series and disposed between the control terminal of the drive transistor and the conduction terminal of the drive transistor that leads to the light-emitting element. The TFT T3 functions as a write control transistor, with the control terminal thereof being connected to the first scan line GAi. The TFT T1 functions as a first initialization transistor for initializing the electrical potential on the control terminal of the drive transistor. The TFT T7 functions as a second initialization transistor for initializing the electrical potential on one of the terminals of the light-emitting element. The TFTs T5 and T6 function as light emission control transistors, with the control terminals thereof being connected to the light-emission control line Ei.

Figure 3:
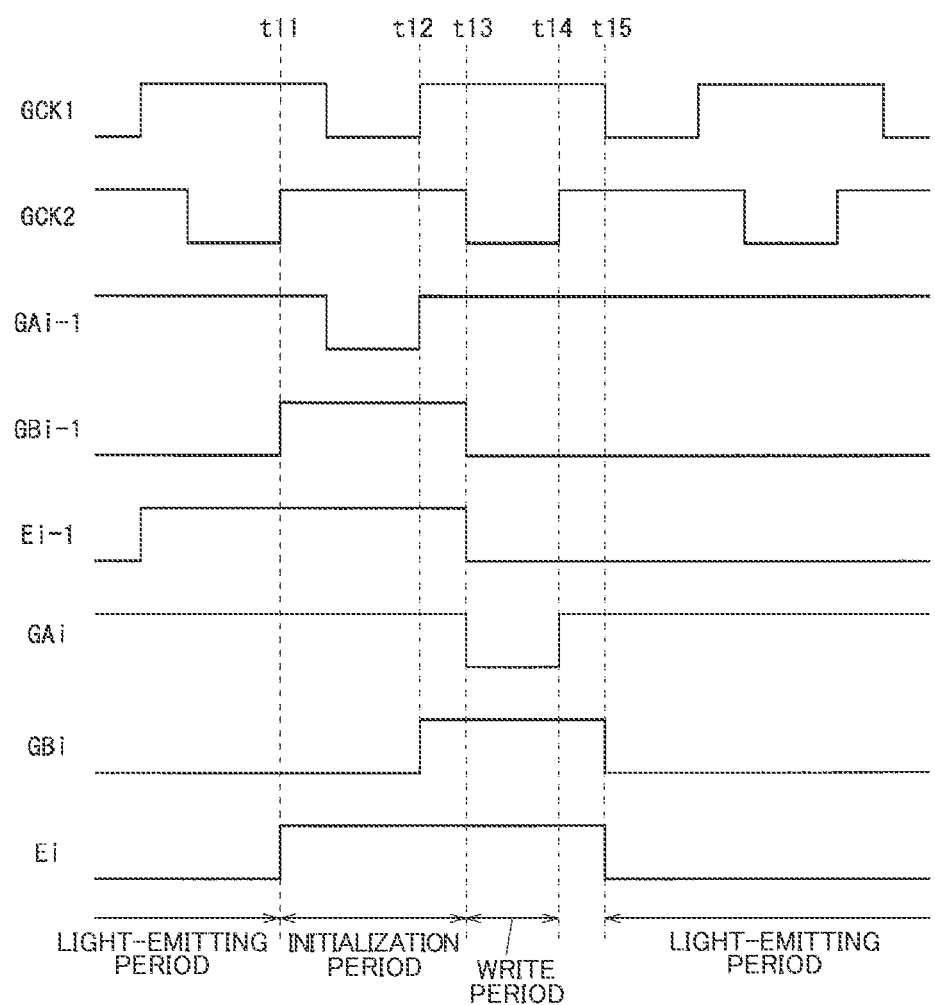
FIG. 3 is a timing chart for the display device shown in FIG. 1.

FIG. 3 is a timing chart for the pixel circuit 20. The scan line/control line drive circuit 13 is fed with gate clocks GCK1 and GCK2 that change as shown in FIG. 3. The scan line/control line drive circuit 13 selectively applies a HIGH potential and a LOW potential to the first scan lines GA1 to GAm, the second scan lines GB0 to GBm, and the light-emission control lines E1 to Em on the basis of the gate clocks GCK1 and GCK2. The electrical potential on each signal line changes with a delay that is equal to a prescribed length of time after the electrical potential on another signal line of the same type that is selected immediately before that signal line. For instance, the electrical potential on the first scan line GAi changes after the electrical potential on the first scan line GAi−1 with a delay of (t14−t12). The HIGH potential applied to the first scan line GAi is at the same level as the HIGH potential applied to the second scan line GBi. The LOW potential applied to the first scan line GAi is at the same level as the LOW potential applied to the second scan line GBi.

A description is now given of the operation of the pixel circuit 20 in row i, column j with reference to FIG. 3 in which the period from time t11 to time t13 is an initialization period, the period from time t13 to time t14 is a write period, and the period before time t11 and the period after time t15 are light-emitting periods. Before time t11, the electrical potential on the first scan line GAi is HIGH, and the electrical potentials on the second scan lines GBi−1 and GBi and the light-emission control line Ei are LOW. Therefore, the TFTs T1, T2p, T2n, T3, and T7 are OFF, and the TFTs T5 and T6 are ON.

At time t11, the electrical potentials on the second scan line GBi−1 and the light-emission control line Ei go HIGH, turning on the TFTs T1 and T7 and turns off the TFTs T5 and T6. That in turn renders the gate potential of the TFT T4 and the anode potential of the OLED L1 equal to the initialization electrical potential Vini. The initialization electrical potential Vini is dictated by the LOW potential which turns on the TFT T4 at time t13. The electrical potential on the second scan line GBi goes HIGH at time t12, turning on the TFT T2n.

The electrical potentials on the first scan line GAi and the second scan line GBi−1 go LOW at time t13, turning off the TFTs T1 and T7 and turns on the TFTs T2p and T3. A data potential Vdata is applied to the data line Sj in accordance with a video signal Di at time t13 onwards. That causes an electric current to flow from the data line Sj to the gate terminal of the TFT T4 via the TFTs T3, T4, T2n, and T2p, increasing the gate potential of the TFT T4. When the gate-to-source voltage of the TFT T4 becomes equal to a threshold voltage Vth (<0) of the TFT T4, the electric current stops flowing. The gate potential of the TFT T4 is therefore equal to (Vdata+Vth) when the electric current stops flowing. The voltage across the capacitor C1 is equal to the difference between the HIGH power supply electrical potential ELVDD and the gate potential of the TFT T4 (ELVDD−Vdata−Vth). The electrical potential on the first scan line GAi goes HIGH at time t14, turning off the TFT T2p.

The electrical potentials on the second scan line GBi and the light-emission control line Ei go LOW at time t15, turning off the TFT T2n and turns on the TFTs T5 and T6. At time t15 onwards, an electric current Id flows from the electrically conductive member having the HIGH power supply electrical potential ELVDD to the electrically conductive member having the LOW power supply electrical potential ELVSS via the TFTs T5, T4, and T6 and the OLED L1. The electric current Id is given by equation (1) below.

$$Id = k(Vgs + Vth)^2 \quad (1)$$

where k is a constant, and Vgs is the gate-to-source voltage of the TFT T4. Since the voltage Vgs is equal to the voltage across the capacitor C1, the electric current Id is given by equation (2) below.

$$Id = k\{(ELVDD - Vdata - Vth) + Vth\}^2 = k(EVDD - Vdata)^2 \quad (2)$$

The electric current Id changes with the data potential Vdata, not with the threshold voltage Vth of the TFT T4. The OLED L1 therefore emits light at a luminance that matches the data potential Vdata, regardless of the threshold voltage Vth of the TFT T4. This enables internal compensation where the fluctuations and variations of the characteristics (threshold voltage) of the TFT T4 are compensated for inside the pixel circuit 20 by controlling the electrical potentials on the signal lines connected the pixel circuit 20 as shown in FIG. 3.

The electrical potential at which the TFT in the pixel circuit 20 is turned on is referred to as the ON potential, and the electrical potential at which the TFT in the pixel circuit 20 is turned off is referred to as the OFF potential. The LOW potential is the ON potential, and the HIGH potential is the OFF potential, in a P-channel TFT. The HIGH potential is the ON potential, and the LOW potential is the OFF potential, in a N-channel TEL After both the TFTs T2p and T2n in the pixel circuit 20 are turned on, the TFT T2p is turned off earlier than the TFT T2n. The period in which the ON potential is applied to the first scan line GAi partially overlaps the period in which the ON potential is applied to the associated second scan line GBi. The period in which the ON potential is applied to the first scan line GAi does not overlap the period in which the ON potential is applied to the adjacent, first scan line GAi−1. The period in which the ON potential is applied to the second scan line GBi partially overlaps the period in which the ON potential is applied to the adjacent, second scan line GBi−1. The period in which the ON potential is applied to the second scan line GBi is longer than the period in which the ON potential is applied to the first scan line GAi.

Figure 4:
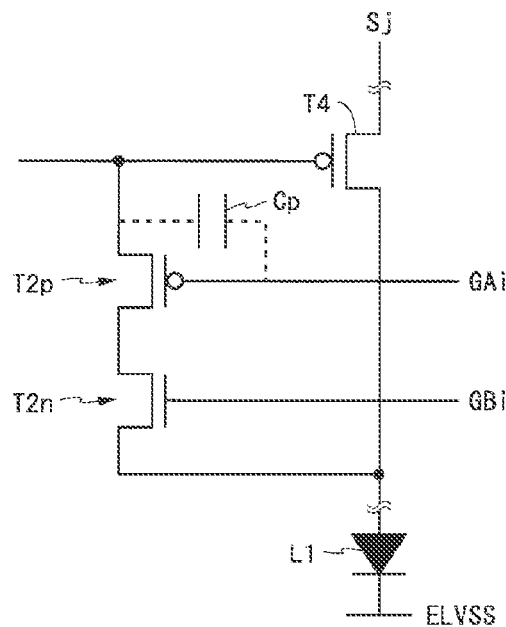
FIG. 4 is a diagram of a part of FIG.
Figure 5:
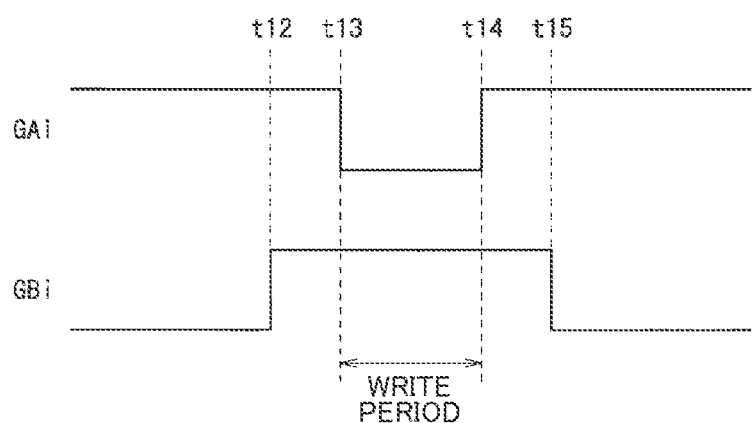
FIG. 5 is a diagram of a part of FIG. 3.

FIG. 4 is a diagram of a part of FIG. 2. FIG. 4 shows a parasitic capacitance Cp between the gate terminal and the first conduction terminal of the TFT T2p. FIG. 5 is a diagram of a part of FIG. 3. A description is given next of the effects of the display device 10 including the pixel circuit 20 with reference to FIGS. 4 and 5. Before time t12, the electrical potential on the first scan line GAi is HIGH, the electrical potential on the second scan line GBi is LOW, and both the TFTs T2n and T2p are OFF. The electrical potential on the second scan line GBi goes HIGH at time t12, turning on the TFT T2n. The electrical potential on the first scan line GAi goes LOW at time t13, turning on the TFT T2p. The gate potential of the TFT T4 then changes to (Vdata+Vth). The pixel circuit 20 needs to maintain the gate potential of the TFT T4 when the gate potential of the TFT T4 changes to (Vdata+Vth).

The electrical potential on the first scan line GAi goes HIGH at time t14, turning off the TFT T2p. Due to the presence of the parasitic capacitance Cp, the gate potential of the TFT T4 increases with an increase in the electrical potential on the first scan line GAL Since the TFT T4 has a P-channel, an increase in the gate potential of the TFT T4 causes a decrease in the electric current flowing through the TFT T4, which in turn decreases the luminance of the OLED L1 In this manner, when the TFT T2p is turned off at time t14, the gate potential of the TFT T4 changes in such a manner as to decrease the luminance of the OLED L1. No washed-out black is hence caused by the turning-off of the TFT T2p.

The electrical potential on the second scan line GBi goes LOW at time t15, turning off the TFT T2n. Since the TFT T2p has been OFF, the gate potential of the TFT T4 does not change even if the electrical potential on the second scan line GBi decreases. Therefore, the electric current flowing through the TFT T4 does not change, and the luminance of the OLED L1 does not change. No washed-out black is hence caused by the turning-off of the TFT T2n.

The display device 10 in accordance with the present embodiment therefore does not cause a change in the data potential, thereby restraining washed-out black that could otherwise be caused by the turning-off of the TFT T2n, when the TFT T2n, which has a different conductivity type from the TFT T4, is used as a compensation transistor. In addition, the use of an IGZO- or other oxide semiconductor-based transistor as the TFT T2n enables low-frequency drive, thereby reducing the power consumption of the display device 10.

As described above, the display device 10 in accordance with the present embodiment includes: the display unit 11 including the first scan lines GA1 to GAm, the second scan lines GB0 to GBm, the data lines S1 to Sn, and the pixel circuits 20; and the drive circuits (scan line/control line drive circuit 13 and data line drive circuit 14) for driving the first scan lines GA1 to GAm, the second scan lines GB0 to GBm, and the data lines S1 to Sn. Each pixel circuit 20 includes the light-emitting element (OLED L1), the drive transistor (TFT T4) of the first conductivity type (P-channel type) for controlling the magnitude of the electric current flowing through the light-emitting element, the first compensation transistor (TFT T2p) of the first conductivity type with the control terminal (gate terminal) thereof being connected to the first scan line GAi, and the second compensation transistor (TFT T2n) of the second conductivity type (N-channel type) with the control terminal thereof being connected to the second scan line GBi. The first and second compensation transistors are connected in series and disposed between the control terminal of the drive transistor and the conduction terminal (drain terminal) of the drive transistor that leads to the light-emitting element.

According to the display device 10 in accordance with the present embodiment, the first and second compensation transistors, which are connected in series and of different conductivity types, are disposed between the control terminal of the drive transistor and the conduction terminal of the drive transistor that leads to the light-emitting element, so as to enable suitable control of the conduction states of the first and second compensation transistors. The display device 10 in accordance with the present embodiment therefore can restrain the electrical potential on the control terminal of the drive transistor from changing in such a manner as to increase the luminance of the light-emitting element, which could otherwise be caused by the turning-off of the second compensation transistor of a different conductivity type from the drive transistor, thereby restraining washed-out black.

The first conduction terminal (top side terminal in FIG. 2) of the first compensation transistor is connected to the control terminal of the drive transistor. The second conduction terminal of the first compensation transistor is connected to the second conduction terminal (top side terminal in FIG. 2) of the second compensation transistor. The first conduction terminal of the second compensation transistor is connected to the conduction terminal of the drive transistor that leads to the light-emitting-element. After both the first and second compensation transistors in the pixel circuit 20 are turned on, the first compensation transistor is turned off earlier than the second compensation transistor. The electrical potential on the control terminal of the drive transistor therefore changes in such a manner as to decrease the luminance of the light-emitting element when the first compensation transistor is turned off and does not change when the second compensation transistor is turned off. This structure therefore can restrain the electrical potential on the control terminal of the drive transistor from changing in such a manner as to increase the luminance of the light-emitting element, which could otherwise be caused by the turning-off of the second compensation transistor of a different conductivity type from the drive transistor, thereby restraining washed-out black.

The first conductivity type has a P-channel. The transistors of the first conductivity type in the pixel circuit 20, including the first compensation transistor, are made of a low-temperature polysilicon. The transistors of the second conductivity type in the pixel circuit 20, including the second compensation transistor, are made of an oxide semiconductor. This structure prevents electric charge leak through the gate terminal of the drive transistor and fluctuation of the gate potential of the drive transistor, and can still restrain washed-out black. The structure can additionally implement low-frequency drive, thereby reducing the power consumption of the display device 10.

The HIGH potential applied to the first scan line GAi is at the same level as the HIGH potential applied to the second scan line Ca. The LOW potential applied to the first scan line GAi is at the same level as the LOW potential applied to the second scan line GBi. Washed-out black can be restrained even when the electrical potentials applied to the first and second scan lines are specified in this manner.

The period in which the ON potential (LOW potential) is applied to the first scan line GAi partially overlaps the period in which the ON potential (HIGH potential) is applied to the associated second scan line GBi. The period in which the ON potential is applied to the first scan line GAi does not overlap the period in which the ON potential is applied to the adjacent, first scan lines GAi−1 and GAi+1. The period in which the ON potential is applied to the second scan line GBi partially overlaps the period in which the ON potential is applied to the adjacent, second scan lines GBi−1 and GBi+1.

The period in which the ON potential is applied to the second scan line G is longer than the period in which the ON potential is applied to the first scan line. Washed-out black can be restrained even when the periods in which the ON potential is applied to the first and second scan lines are specified in this manner.

The pixel circuit 20 includes the write control transistor (TFT T3) with the control terminal thereof being connected to the first scan line GAL This structure enables control of the write control transistor through the first scan line GAi used to control the first compensation transistor, thereby controlling writing to the pixel circuit 20. The pixel circuit 20 includes: the first initialization transistor (TFT T1) for initializing the electrical potential on the control terminal of the drive transistor; and the second initialization transistor (TFT T7) for initializing the electrical potential on one of the terminals (anode terminal) of the light-emitting element. The first and second initialization transistors are made of an oxide semiconductor. The control terminals of the first and second initialization transistors are connected to the second scan line GBi−1, which is selected immediately before the second scan line GBi. This structure enables control of the first and second initialization transistors through the second scan line GBi−1 used to control the second compensation transistor, thereby enabling initializing the electrical potential on the control terminal of the drive transistor and the electrical potential on one of the terminals of the light-emitting element.

Second Embodiment

A display device in accordance with a second embodiment has the same structure as the display device in accordance with the first embodiment (see FIG. 1). The display device in accordance with the present embodiment differs from the display device in accordance with the first embodiment in that the pixel circuits 20 are replaced by the pixel circuits described below. The following description will focus on differences from the first embodiment.

Figure 6:
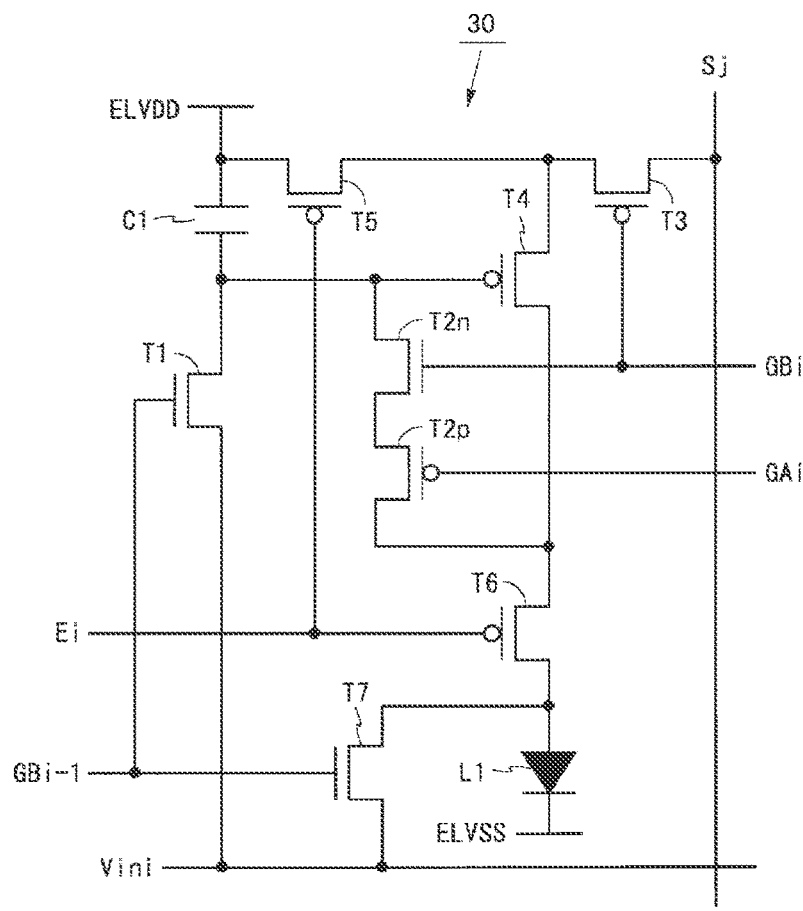
FIG. 6 is a circuit diagram of a pixel circuit in a display device in accordance with a second embodiment.

FIG. 6 is a circuit diagram of a pixel circuit in the display device in accordance with the present embodiment. A pixel circuit 30 shown in FIG. 6 has the same structure as the pixel circuit 20 except that the TFT T2$p$ and the TFT T2$n$ are transposed. In the pixel circuit 30, the TFT T2$n$ has a second conduction terminal (top side terminal in FIG. 6) connected to the gate terminal of the TFT T4 and a first conduction terminal connected to the first conduction terminal (top side terminal in FIG. 6) of the TFT T2$p$. The TFT T2$p$ has a second conduction terminal connected to the drain terminal of the TFT T4 (conduction terminal leading to the OLED L1) and the source terminal of the TFT T6, The display device in accordance with the present embodiment operates as represented by the timing charts of FIGS. 3 and 5.

Figure 7:
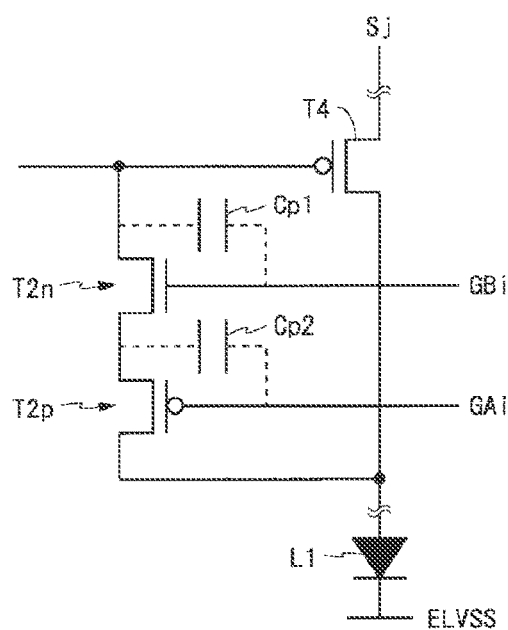
FIG. 7 is a diagram of a part of FIG. 6.

FIG. 7 is a diagram of a part of FIG. 6. FIG. 7 shows a parasitic capacitance Cp1 between the gate terminal and the second conduction terminal of the TFT T2$n$ and a parasitic capacitance Cp2 between the gate terminal and the first conduction terminal of the TFT T2$p$. A description is given next of the effects of the display device in accordance with the present embodiment including the pixel circuit 30 with reference to FIGS. 5 and 7. Before time t14, the pixel circuit 30 operates in the same fashion as the pixel circuit 20.

The electrical potential on the first scan line GAi goes HIGH at time t14, turning off the TFT T2$p$. Due to the presence of the parasitic capacitance Cp2 and with the TFT T2$n$ being ON, the gate potential of the TFT T4 increases (the electrical potential is boosted up) with an increase in the electrical potential on the first scan line GAi. The electrical potential on the second scan line GBi goes LOW at time t15, turning off the TFT T2$n$. The gate potential of the TFT T4 decreases (the electrical potential is boosted down) with a decrease in the electrical potential on the second scan line GBi due to the presence of the parasitic capacitance Cp1.

The gate potential of the TET T4 increases (is boosted up) at time t14 and decreases (boosted down) at time t15 in this manner. The increase (boost-up) in the electrical potential cancels out the decrease (boost-down) in the electrical potential. The gate potential of the TFT T4 at time t15 onwards is therefore at the same level as the gate potential of the TFT T4 before time t14. Hence, the use of the pixel circuit 30 can restrain washed-out black, which could otherwise be caused by the turning-off of the TFT T2$n$.

As described above, in the display device in accordance with the present embodiment, the second conduction terminal (top side terminal in FIG. 8) of the second compensation transistor (TFT T2n) is connected to the control terminal (gate terminal) of the drive transistor TFT T4), the first conduction terminal of the second compensation transistor is connected to the first conduction terminal (top side terminal in FIG. 8) of the first compensation transistor (TFT T2p), and the second conduction terminal of the first compensation transistor is connected to the conduction terminal (drain terminal) of drive transistor that leads to the light-emitting element. After both the first and second compensation transistors in the pixel circuit 30 are turned on, the first compensation transistor is turned off earlier than the second compensation transistor in the present embodiment, similarly to the previous embodiment.

The electrical potential on the control terminal of the drive transistor changes in such a manner as to decrease the luminance of the light-emitting element when the first compensation transistor is turned off and changes in such a manner as to increase the luminance of the light-emitting element when the second compensation transistor is turned off. The first and second changes in the electrical potential on the control terminal of the drive transistor are cancelled out. That can in turn restrain the electrical potential on the control terminal of the drive transistor from changing, which could otherwise be caused by the turning-off of the second compensation transistor of a different conductivity type from the drive transistor, thereby restraining washed-out black. In addition, the display device in accordance with the present embodiment can achieve the same effects as the display device 10 in accordance with the first embodiment.

Figure 8:
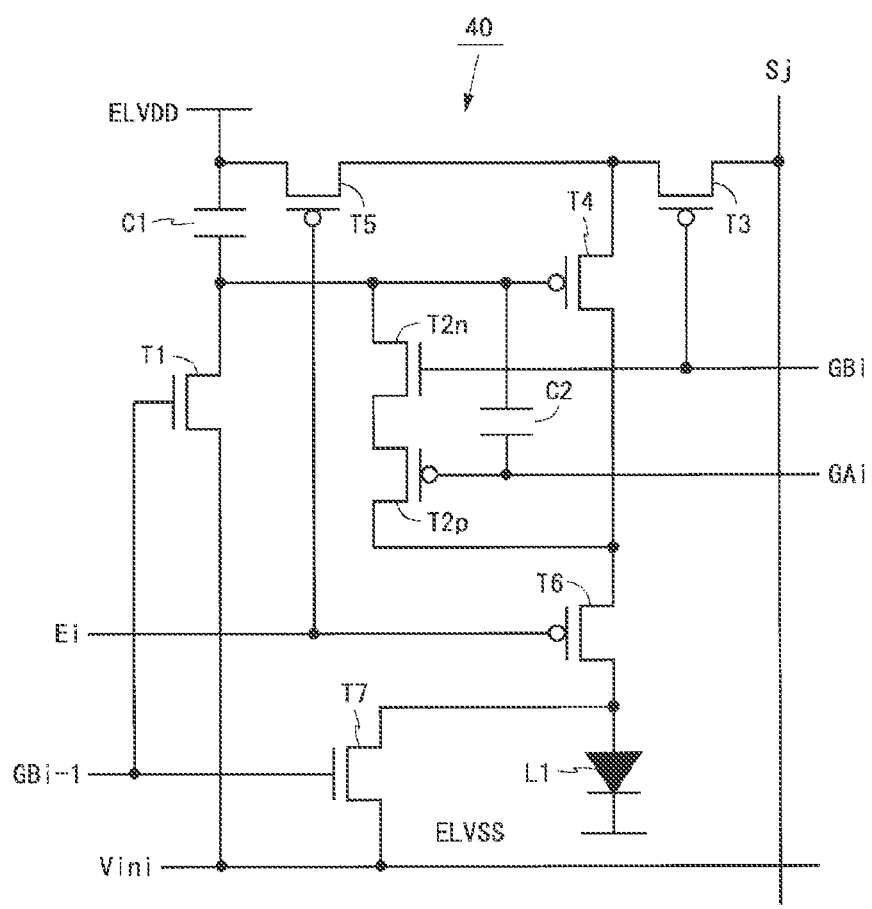
FIG. 8 is a circuit diagram of a pixel circuit in a display device in accordance with a first variation example.

The display devices in accordance with the first and second embodiments (hereinafter, the "preceding embodiments") can be modified to constitute many variation examples. FIG. 8 is a circuit diagram of a pixel circuit in a display device in accordance with a first variation example. A pixel circuit 40 shown in FIG. 8 has the same structure as the pixel circuit 30 (FIG. 6) in accordance with the second embodiment except that the former includes a capacitor C2. The capacitor C2 is disposed between the control terminal of the drive transistor and the control terminal of the first compensation transistor. Specifically, one of the electrodes of the capacitor C2 (top side electrode in FIG. 8) is connected to the gate terminal of the TFT T4. The other electrode of the capacitor C2 is connected to the gate terminal of the TFT T2p. This provision of the capacitor C2 between the control terminal of the drive transistor and the control terminal of the first compensation transistor suitably cancels out the increase (boost-up) in the electrical potential through the parasitic capacitance (not shown) and the decrease (boost-down) in the electrical potential through the capacitor C2. That in turn restrains washed-out black, which could otherwise be caused by the turning-off of the second compensation transistor of a different conductivity type from the drive transistor.

In the display devices in accordance with the preceding embodiments, when both the first and second compensation transistors are OFF, the second compensation transistor (TFT T2n) is turned on earlier than the first compensation transistor (TFT T2p); and when both the first and second compensation transistors are ON, the first compensation transistor is turned off earlier than the second compensation transistor. In contrast, the first compensation transistor is turned on earlier than the second compensation transistor in a display device in accordance with a second variation example when both the first and second compensation transistors are OFF; and the second compensation transistor is turned off earlier than the first compensation transistor in a display device in accordance with a third variation example when both the first and second compensation transistors are ON. The display devices in accordance with the second and third variation examples can achieve the same effects as the display devices in accordance with the preceding embodiments. Alternatively, in the display device in accordance with the first variation example, the second compensation transistor may be turned off earlier than the first compensation transistor when both the first and second compensation transistors are ON. In this display device, the electrical potential on the control terminal of the drive transistor is increased (boosted up) through the parasitic capacitance (not shown) and thereafter decreased (boosted down) through the capacitor C2. The increase (boost-up) in the electrical potential hence suitably cancels out the decrease (boost-down) in the electrical potential.

The control terminals of the first and second initialization transistors (TFTs T1 and T7) are connected to the second scan line GBi, which is selected immediately before the second scan line GBi, in the display devices in accordance with the preceding embodiments. The control terminal of the first initialization transistor is connected to the second scan line GBi–2, which is selected two second scan lines before the second scan line GBi, or to the second scan line that is selected before the second scan line GBi–2, in a display device in accordance with a fourth variation example. In a display device in accordance with a fifth variation example, the control terminal of the second initialization transistor is connected to the second scan line GBi or the second scan line that is selected two or more second scan lines before the second scan line GBi. The display devices in accordance with the fourth and fifth variation examples can achieve the same effects as the display devices in accordance with the preceding embodiments.

Each drive transistor has a P-channel in the pixel circuit in the display devices in accordance with t preceding embodiments. Each drive transistor may have a N-channel in the pixel circuit in a display device in accordance with a sixth variation example. In each pixel circuit in the display device in accordance with a seventh variation example, each transistor is of an opposite conductivity type to the corresponding transistor in the pixel circuit described above. The polarity of the electrical potential applied to each signal line connected to the pixel circuit in the display device in accordance with the seventh variation example is opposite to that for the original pixel circuit (the HIGH and LOW potentials are reversed).

The HIGH potential applied to the first scan line GAi is at the same level as the HIGH potential applied to the second scan line GBi; the LOW potential applied to the first scan line GAi is at the same level as the LOW potential applied to the second scan line GBi; and the voltage on the first scan line GAi has the same amplitude as the voltage on the second scan line GBi, in the display devices in accordance with the preceding embodiments. In a display device in accordance with an eighth variation example, the voltage on the first scan line GAi has a greater amplitude than the voltage on the second scan line GBi. Particularly, in the display device in accordance with the second embodiment, the voltage on the first scan line GAi preferably has a greater amplitude than the voltage of the second scan line GBi. The increase (boost-up) in the electrical potential and the decrease (boost-down) in the electrical potential can be suitably cancelled out by adjusting the amplitude of the voltage on the first scan line GAi and the amplitude of the voltage on the second scan line GBi in accordance with the electrostatic capacities of the parasitic capacitances Cp1 and Cp2 shown in FIG. 7.

Figure 9:
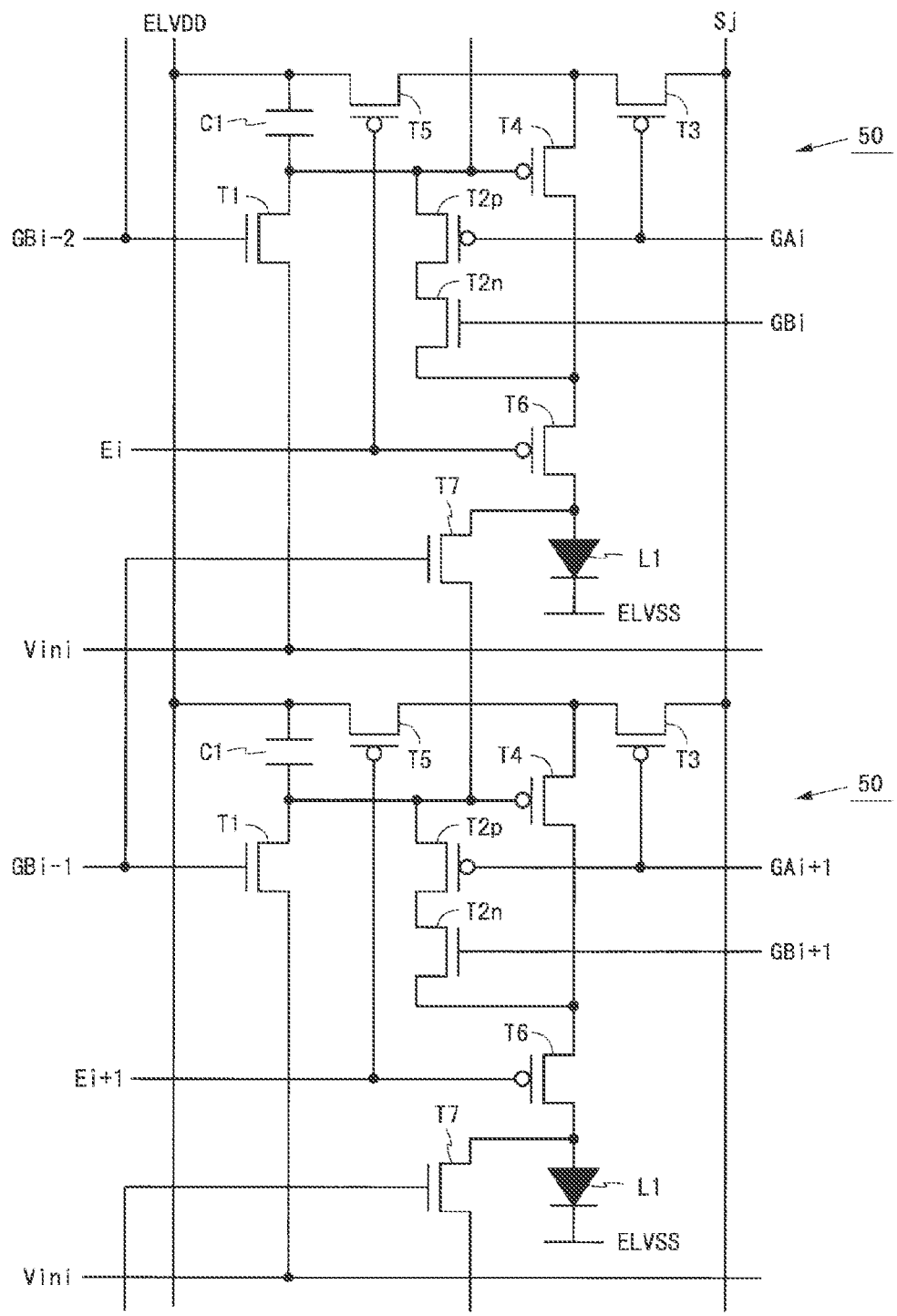
FIG. 9 is a circuit diagram of a pixel circuit in a display device in accordance with a ninth variation example.

The first and second initialization transistors (TFTs T1 and T7) are connected in parallel in the pixel circuits in the display device in accordance with the preceding embodiments. The first and second initialization transistors are made of an oxide semiconductor and connected in series in the pixel circuits in a display device in accordance with a ninth variation example. FIG. 9 is a circuit diagram of the pixel circuit in the display device in accordance with the ninth variation example. FIG. 9 shows a row i, column j pixel circuit 50 and a row (i+1), column j pixel circuit 50. A description is given next of the row i, column j pixel circuit 50.

In the row i, column j pixel circuit 50, the gate terminal of the TFT T1 is connected to the second scan line GBi−2; the gate terminal of the TFT T7 is connected to the second scan line GBi−1; and the source terminal of the TFT T7 is connected to the gate terminal of the TFT T4 in the row (i+1), column j pixel circuit.

Figure 10:
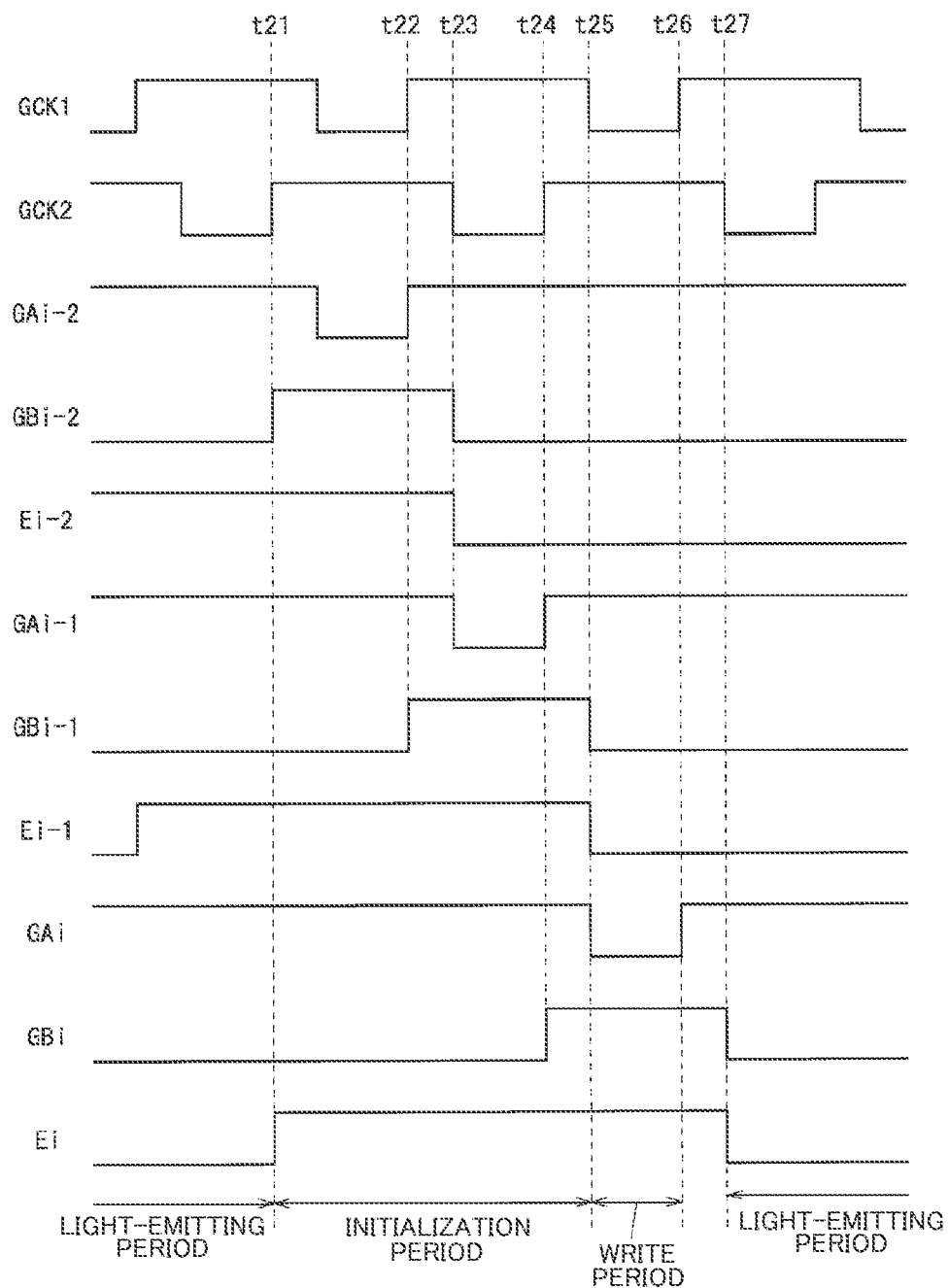
FIG. 10 is a timing chart for the display device m accordance with the ninth variation example.

FIG. 10 is a timing chart for the display device in accordance with the ninth variation example. In FIG. 10, the period from time t21 to time t25 is an initialization period, the period from time t25 to time t26 is a write period, and the period before time t21 and the period after time t27 are light-emitting periods. The electrical potential on the second scan line GBi−2 is HIGH from time t21 to time t23. At this time, the TFT T1 is turned on, and the gate potential of the TFT T4 becomes equal to the initialization electrical potential Vini. The electrical potential on the second scan line GBi−1 is HIGH from time t22 to time t25. At this time, the TFT T7 is turned on, and the anode terminal of the OLED L1 is fed with the initialization electrical potential Vini applied to the gate terminal of the TFT T4 in the row (i+1), column j pixel circuit.

Since the two pixel circuits 50 are connected through the TFTs T1 and T7, a leak current through the TFTs T1 and T7 in the pixel circuits 50 may cause the pixel circuits 50 to malfunction if the TFTs T1 and 17 are made of a low-temperature polysilicon. The TFTs T1 and 17 are therefore made of an oxide semiconductor such as IGZO in the display device in accordance with the ninth variation example, which prevents the pixel circuits 50 from malfunctioning due to the leak current through the TFTs T1 and T7.

Connecting the TFTs T1 and T7 in series reduces the number of signal lines connected to the electrically conductive member having the initialization electrical potential Vini and hence reduces load on this electrically conductive member. Therefore, in the display device in accordance with the ninth variation example, the pixel circuits 50 are fed with an initialization electrical potential Vini that is stable to noise.

Figure 11:
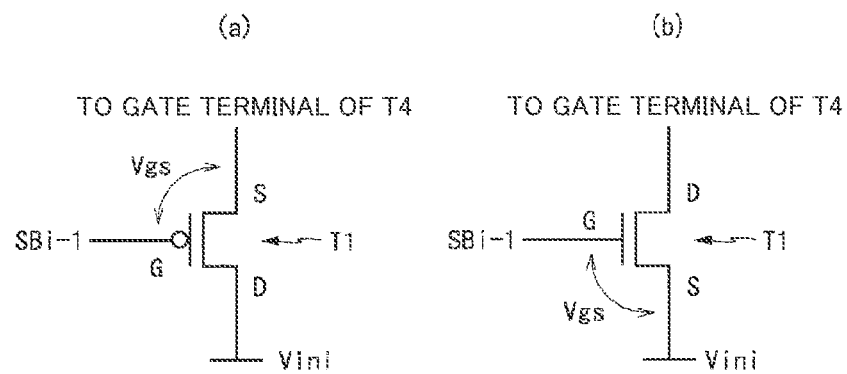
FIG. 11 is a set of diagrams illustrating effects of a N-channel transistor used as an initialization transistor.
Figure 12:
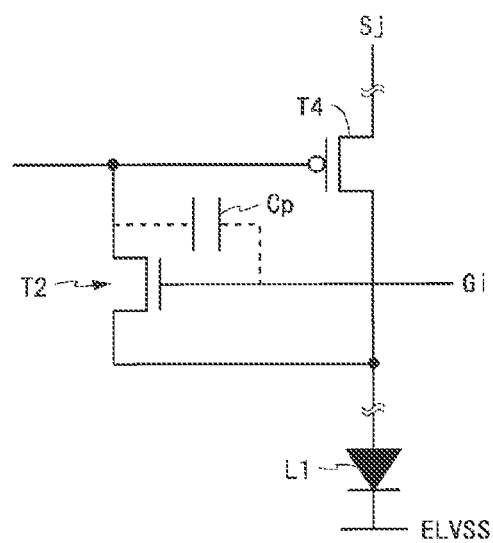
FIG. 12 is a diagram of a part of a pixel circuit in a known display device.
Figure 13:
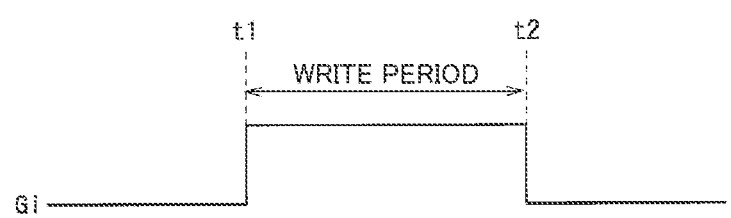
FIG. 13 is a timing chart for the known display device.

A description is given next of the effects of the use of the N-channel transistor, in place of the P-channel transistor, as the initialization transistor with reference to FIG. 11. Assume here that the initialization electrical potential Vini is −5 V, the HIGH potential on the second scan line GBi−1 is 7 V, the LOW potential on the second scan line GBi−1 is −10 V, and the gate potential of the TFT T4 is decreased by initialization from a preceding frame electrical potential (>Vini) to the initialization electrical potential Vini.

If the TFT T1 is a P-channel transistor (FIG. 11(a)), a gate-to-source voltage Vgs of the TFT T1 decreases with the progress of initialization, eventually to −5 V On the other hand, if the TFT T1 is a N-channel transistor (FIG. 11(b)), since the TFT T1 is grounded through the source terminal thereof, the gate-to-source voltage Vgs of the TFT T1 is constant at 15 V irrespective of the progress of initialization. In addition, the TFT T1, which has a N-channel, exhibits a high drive capability when the gate-to-source voltage Vgs is equal to 15 V. The same applies to the TFT T7. For these reasons, the use of a N-channel transistor as the initialization transistor enables quick completion of the initialization of the gate potential of the TFT T4 and the initialization of the anode potential of the OLED L1. That in turn renders the display device more adaptable to high frame frequency display.

The description has so far discussed OLED display devices including pixel circuits including OLEDs (organic light-emitting diodes) as an example of a display device including pixel circuits including light-emitting elements. The same description applies to inorganic LED display devices including pixel circuits including inorganic light-emitting diodes, QLED (quantum-dot light-emitting diode) display devices including pixel circuits including quantum-dot light-emitting diodes, LED display devices including pixel circuits including mini-LEDs or micro-LEDs. Any of the features of the display devices described above may be combined as far as the combination does not contradict the nature of the features, so as to constitute a display device that has both the features of any of the preceding embodiments and the features of any of the variation examples.

The invention claimed is:

1. A display device comprising:
  a display unit including a plurality of first scan lines, a plurality of second scan lines, a plurality of data lines, and a plurality of pixel circuits; and
  a drive circuit configured to drive the plurality of first scan lines, the plurality of second scan lines, and the plurality of data lines, wherein
  each of the plurality of pixel circuits includes:
    a light-emitting element;
    a drive transistor configured to control a magnitude of an electric current that flows through the light-emitting element, the drive transistor being of a first conductivity type;
    a first compensation transistor having a control terminal connected to an associated one of the plurality of first scan lines, the first compensation transistor being of the first conductivity type; and
    a second compensation transistor having a control terminal connected to an associated one of the plurality of second scan lines, the second compensation transistor being of a second conductivity type, and
  the first and second compensation transistors are connected in series and disposed between a control terminal and a conduction terminal of the drive transistor, the conduction terminal leading to the light-emitting element.

2. The display device according to claim 1, wherein
  the first compensation transistor has a first conduction terminal connected to the control terminal of the drive transistor,
  the first compensation transistor has a second conduction terminal connected to a second conduction terminal of the second compensation transistor, and
  the second compensation transistor has a first conduction terminal connected to the conduction terminal of the drive transistor.

3. The display device according to claim 1, wherein
  the second compensation transistor has a second conduction terminal connected to the control terminal of the drive transistor, the second compensation transistor has a first conduction terminal connected to a first conduction terminal of the first compensation transistor, and the first compensation transistor has a second conduction terminal connected to the conduction terminal of the drive transistor.

4. The display device according to claim 3, wherein each of the plurality of pixel circuits further includes a capacitor between the control terminal of the drive transistor and the control terminal of the first compensation transistor.

5. The display device according to claim 1, wherein the first conductivity type is a P-channel type.

6. The display device according to claim 1, wherein
the first compensation transistor contains a low-temperature polysilicon, and
the second compensation transistor contains an oxide semiconductor.

7. The display device according to claim 1, wherein
the transistors of the first conductivity type in the plurality of pixel circuits contain a low-temperature polysilicon, and
the transistors of the second conductivity type in the plurality of pixel circuits contain an oxide semiconductor.

8. The display device according to claim 1, wherein in each of the plurality of pixel circuits, the first compensation transistor is turned off earlier than the second compensation transistor after both the first and second compensation transistors are ON.

9. The display device according to claim 1, wherein in each of the plurality of pixel circuits, the second compensation transistor is turned off earlier than the first compensation transistor after both the first and second compensation transistors are ON.

10. The display device according to claim 1, wherein
a HIGH potential applied to the plurality of first scan lines is equal to a HIGH potential applied to the plurality of second scan lines, and
a LOW potential applied to the plurality of first scan lines is equal to a LOW potential applied to the plurality of second scan lines.

11. The display device according to claim 1, wherein a voltage on the plurality of first scan lines has a greater amplitude than does a voltage on the plurality of second scan lines.

12. The display device according to claim 1, wherein a period in which an ON potential is applied to one of the plurality of first scan lines partially overlaps a period in which an ON potential is applied to an associated one of the plurality of second scan lines.

13. The display device according to claim 1, wherein
a period in which an ON potential is applied to one of the plurality of first scan lines does not overlap a period in which an ON potential is applied to those of the plurality of first scan lines which are adjacent to that one of the plurality of first scan lines, and
a period in which an ON potential is applied to one of the plurality of second scan lines partially overlaps a period in which an ON potential is applied to those of the plurality of second scan lines which are adjacent to that one of the plurality of second scan lines.

14. The display device according to claim 1, wherein a period in which an ON potential is applied to the plurality of second scan lines is longer than a period in which an ON potential is applied to the plurality of first scan lines.

15. The display device according to claim 1, wherein
each of the plurality of pixel circuits further includes:
a first initialization transistor configured to initialize an electrical potential on the control terminal of the drive transistor; and
a second initialization transistor configured to initialize an electrical potential on one of terminals of the light-emitting element, and
the first and second initialization transistors contain an oxide semiconductor.

16. The display device according to claim 15, wherein the first initialization transistor has a control terminal connected to one of the plurality of second scan lines that is selected one second scan line before an associated one of the plurality of second scan lines.

17. The display device according to claim 15, wherein the first initialization transistor has a control terminal connected to one of the plurality of second scan lines that is selected two second scan lines before an associated one of the plurality of second scan lines.

18. The display device according to claim 17, wherein an ON potential is applied to one of the plurality of first scan lines after an OFF potential is applied to the one of the plurality of second scan lines that is selected two second scan lines before an associated one of the plurality of second scan lines.

19. The display device according to claim 15, wherein the second initialization transistor has a control terminal connected either to an associated one of the plurality of second scan lines or to one of the plurality of second scan lines that is selected one second scan line before the associated one of the plurality of second scan lines.

20. The display device according to claim 15, wherein the second initialization transistor has a conduction terminal connected to one of terminals of the light-emitting element and a conduction terminal connected to a control terminal of the drive transistor in one of the plurality of pixel circuits that is subsequently selected.

* * * * *